United States Patent
O'Toole et al.

(10) Patent No.: US 11,270,912 B2
(45) Date of Patent: Mar. 8, 2022

(54) METHOD FOR FORMING A VIA HOLE SELF-ALIGNED WITH A METAL BLOCK ON A SUBSTRATE

(71) Applicant: IMEC VZW, Leuven (BE)

(72) Inventors: Martin O'Toole, Overijse (BE); Christopher Wilson, Tervuren (BE); Zsolt Tokei, Leuven (BE); Ryan Ryoung han Kim, Bertem (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 17/110,631

(22) Filed: Dec. 3, 2020

(65) Prior Publication Data
US 2021/0183698 A1    Jun. 17, 2021

(30) Foreign Application Priority Data

Dec. 12, 2019  (EP) ..................................... 19215615

(51) Int. Cl.
*H01L 21/768* (2006.01)

(52) U.S. Cl.
CPC .. *H01L 21/76879* (2013.01); *H01L 21/76802* (2013.01); *H01L 21/76834* (2013.01)

(58) Field of Classification Search
CPC ......... H01L 21/76879; H01L 21/76802; H01L 21/76834; H01L 21/76811; H01L 21/76897

See application file for complete search history.

(56) References Cited

U.S. PATENT DOCUMENTS

| 9,607,893 B1 | 3/2017 | Zhang et al. |
| 9,837,314 B2 | 12/2017 | Smith et al. |
| 10,354,912 B2 | 7/2019 | Xu et al. |

(Continued)

FOREIGN PATENT DOCUMENTS

WO    2015047321 A1    4/2015

OTHER PUBLICATIONS

Extended European Search Report and Written Opinion, EP Application No. 19215615.6, dated Oct. 26, 2020, 5 pages.

(Continued)

*Primary Examiner* — Karen Kusumakar
(74) *Attorney, Agent, or Firm* — McDonnell Boehnen Hulbert & Berghoff LLP

(57) ABSTRACT

Example embodiments relate to methods for forming via holes self-aligned with metal blocks on substrates. One embodiment includes a method where the substrate includes an interlayer dielectric layer. The method includes forming a metallic layer on the interlayer dielectric layer. The method also includes forming a dielectric layer on the metallic layer and forming a plurality of parallel spacer line structures on the dielectric layer. In addition, the method includes forming a sidewall oxide, a first sacrificial layer, and an opening in the first sacrificial layer. Further, the method includes etching the dielectric layer and removing the first sacrificial layer. Additionally, the method includes forming a second sacrificial layer, forming an opening in the second sacrificial layer, depositing a metal block on the metallic layer, and removing the second sacrificial layer. Still further, the method includes etching the metallic layer and the interlayer dielectric layer to form a via hole.

11 Claims, 18 Drawing Sheets

(56) References Cited

U.S. PATENT DOCUMENTS

| | | | |
|---|---|---|---|
| 10,388,600 | B2 | 8/2019 | Reznicek et al. |
| 10,395,986 | B1 | 8/2019 | Briggs et al. |
| 10,424,507 | B2 | 9/2019 | Zhang et al. |
| 2017/0352591 | A1 | 12/2017 | Zhang et al. |
| 2018/0261497 | A1 | 9/2018 | Drissi et al. |
| 2018/0323067 | A1* | 11/2018 | Shu .................... H01L 23/5256 |
| 2019/0096756 | A1 | 3/2019 | Chang et al. |

OTHER PUBLICATIONS

Clark, Lawrence T., Vinay Vashishtha, Lucian Shifren, Aditya Gujja, Saurabh Sinha, Brian Cline, Chandarasekaran Ramamurthy, and Greg Yeric. "ASAP7: A 7-nm finFET predictive process design kit." Microelectronics Journal 53 (2016): 105-115.

Fatehy, Ahmed Hamed, Rehab Kotb, Neal Lafferty, Fan Jiang, and James Word. "Exploring EUV and SAQP pattering schemes at 5nm technology node." In Extreme Ultraviolet (EUV) Lithography IX, vol. 10583, p. 105831X. International Society for Optics and Photonics, 2018.

Shen, Shyng-Tsong, H. Tomizawa, K. Tsumura, M. Tagami, H. Shobha, M. Sankarapandian, O. Van der Straten et al. "64 nm pitch Cu dual-damascene interconnects using pitch split double exposure patterning scheme." In 2011 IEEE International Interconnect Technology Conference, pp. 1-3. IEEE, 2011.

Raley, Angélique, Nihar Mohanty, Xinghua Sun, Richard A. Farrell, Jeffrey T. Smith, Akiteru Ko, Andrew W. Metz, Peter Biolsi, and Anton Devilliers. "Self-aligned blocking integration demonstration for critical sub-40nm pitch Mx level patterning." In Advanced Etch Technology for Nanopatterning VI, vol. 10149, p. 101490O. International Society for Optics and Photonics, 2017.

\* cited by examiner

METHOD FOR FORMING A VIA HOLE SELF-ALIGNED WITH A METAL BLOCK ON A SUBSTRATE

CROSS-REFERENCE TO RELATED APPLICATIONS

The present application is a non-provisional patent application claiming priority to European Patent Application No. EP 19215615.6, filed Dec. 12, 2019, the contents of which are hereby incorporated by reference.

FIELD OF THE DISCLOSURE

The present disclosure relates to a method for forming a via hole self-aligned with a metal block on a substrate.

BACKGROUND

Modern circuit fabrication typically includes processes of forming electrical interconnection structures for interconnecting semiconductor devices in a functioning circuit. An interconnection structure may include one or more interconnection levels or tiers, which are formed above the active device region. An interconnection level includes horizontal conductive paths or lines arranged in an insulating material layer. Conductive paths of different interconnection levels may be interconnected by conductive vias extending vertically through the insulating layers.

In conventional circuit fabrication, an interconnection level is typically formed in what is referred to as a "dual damascene process." According to this approach horizontally extending trenches are etched in an insulating layer. Further, vertically extending via holes are formed in the insulating layer. Thereafter the trenches and via holes are simultaneously filled with a conductive material to form conductive lines in the trenches and conductive vias in the via holes. The process may be repeated to form a stack of interconnection levels.

In modern circuit fabrication, multiple patterning techniques like (litho etch)x, or pitch splitting techniques such as self-aligned double patterning (SADP) or quadruple patterning (SAQP), are typically employed during trench formation to enable conductive line patterns with sub-lithographic critical dimensions.

However, using state-of-the-art patterning and block techniques it is becoming increasingly difficult to produce ever more aggressive line pitches. In particular, it is becoming increasingly difficult to align conductive line ends with vertically extending via holes, due to edge placement errors (EPE) among others at such aggressive line pitches.

SUMMARY

This disclosure provides an improved method allowing for improved self-alignment of a conductive line end with a vertically extending via hole. This disclosure also enables forming of conductive line ends and vertically extending via holes in a reliable and precise manner. Further and alternative features may be understood from the following.

According to an aspect of the present disclosure there is provided a method for forming a via hole self-aligned with a metal block on a substrate, the substrate comprising an interlayer dielectric layer, the method comprising:

forming a metallic layer on the interlayer dielectric layer,
forming a dielectric layer on the metallic layer,
forming a plurality of parallel spacer line structures on the dielectric layer, the parallel spacer line structures extending along an upper surface of the dielectric layer,
forming a sidewall oxide layer on respective sidewalls of the plurality of parallel spacer line structures such that a portion of the dielectric layer is exposed between adjacent sidewall oxide layers of the parallel spacer line structures,
forming a first sacrificial layer covering exposed portions of the dielectric layer and enclosing the parallel spacer line structures,
forming an opening in the first sacrificial layer to expose a first portion of the dielectric layer between adjacent sidewall oxide layers of the parallel spacer line structures,
etching, via the opening in the first sacrificial layer, through the first portion of the dielectric layer, thereby forming an opening in the dielectric layer, exposing a first portion of the metallic layer,
removing the first sacrificial layer,
forming a second sacrificial layer covering the dielectric layer, the first portion of the metallic layer and enclosing the parallel spacer line structures,
forming an opening in the second sacrificial layer, the opening partially overlapping the opening of the dielectric layer and exposing a second portion of the metallic layer, the second portion of the metallic layer corresponding to a portion of the first portion of the metallic layer,
selectively depositing a metal block on the exposed second portion of the metallic layer,
removing the second sacrificial layer, thereby exposing a remaining portion of the first portion of the metallic layer in the opening of the dielectric layer,
etching, via the opening of the dielectric layer, through the remaining portion of the first portion of the metallic layer and the interlayer dielectric layer, thereby forming a via hole self-aligned with the metal block.

The step of selective depositing of the metal block on the exposed second portion of the metallic layer allows depositing the metal block only on the exposed second portion of the metallic layer. Thereby, even if the opening in the second sacrificial layer exposes a portion of the dielectric layer adjacent to the exposed second portion of the metallic layer, the metal block selectively deposits on the exposed second portion of the metallic layer. In other words, the metal block will be formed on the exposed second portion of the metallic layer.

The step of etching via the opening of the dielectric layer, through the remaining portion of the first portion of the metallic layer and the interlayer dielectric layer facilitate the via hole formation self-aligned with the metal block. This is since the metal block and also the dielectric layer act as mask and thereby the via hole becomes self-aligned with the metal block.

The disclosed method addresses the edge placement errors (EPE) by allowing a larger opening in the first sacrificial layer. The allowance of a larger opening in the first sacrificial layer is due to the forming of the sidewall oxide layers on respective sidewalls of the parallel spacer line structures such that a portion of the dielectric layer is exposed between adjacent sidewall oxide layers i.e. forming what is commonly referred to as three different tones. Hence, a larger opening, less prone to alignment misplacement, may consequently be formed in the first sacrificial layer while still being able to accurately align the metal block and the via hole. In other words, the disclosed method allows forming the via hole self-aligned with the metal block. The self-aligning of the via hole with the metal block is due to the larger opening in the first sacrificial layer and also due to the forming of the opening in the second sacrificial layer partially overlapping the opening of the dielectric layer and exposing a second portion of the metallic layer. Because the via hole is formed self-aligned with the metal block, the metal block may define a conductive line end. Thereby, the disclosed method allows accurately placing the via hole at a conductive line end. In addition, accurately placing the via hole at a conductive line end may simplify optical proximity correction (OPC) and hence facilitate fabrication of modern circuits. Furthermore, the disclosed method allows for ever more aggressive line pitches e.g. by density improvement. Example embodiments need not allow for a line end extension for a via placement. The disclosed method is also compatible with the via hole and the metal block being separate or isolated. It should be noted that the disclosed method may further proceed in an understood manner, such as dual damascene process to transfer a pattern obtained by the disclosed method into the interlayer dielectric layer.

By "forming an opening in the second sacrificial layer, the opening partially overlapping the opening of the dielectric layer" is hereby meant that the opening in the second sacrificial layer may correspond to a portion of the opening in the first sacrificial layer. The opening in the second sacrificial layer may also be wider e.g. along the parallel spacer line structures with respect to the opening in the first sacrificial layer. In other words, the opening in the second sacrificial layer may also include a portion of the dielectric layer adjacent to the second portion of the metallic layer.

By "the second portion of the metallic layer corresponding to a portion of the first portion of the metallic layer" is hereby meant that the second portion of the metallic layer is a portion of the first portion of the metallic layer.

By "exposing a remaining portion of the first portion of the metallic layer" is hereby meant exposing a portion of the first portion of the metallic layer not covered by the metal block.

The metallic layer may include any of or any combination of TiN, Ru, AlON, AlN, Pt, and $TiO_2$. The metallic layer may be made of any of or any combination of TiN, Ru, AlON, AlN, Pt, and $TiO_2$. The metallic layer may be made of TiN. TiN may facilitate the step of etching as TiN may be etched in a controlled way e.g. to achieve smooth sharp features. TiN may also facilitate the step of forming the metallic layer since the stress in the TiN layer may be controlled. This may in turn result into an improved control on the roughness of the line edges obtained, subsequent to the transfer of the pattern obtained by the disclosed method into the interlayer dielectric layer.

The metal block may include any of or any combination of Ru, Rh, Pd, Os, Ir, and Pt. The metal block may be made of any of or any combination of the platinum group metals including Ru, Rh, Pd, Os, Ir, and Pt. The metal block may be made of a metal that may selectively be etched with respect to the metallic layer and the interlayer dielectric layer in the step of etching. In the case that the metallic layer is made of TiN, the metal block may be made of Ru, as TiN provides an adhesion layer for Ru metal block. Moreover, if the metallic layer is made of TiN, the metal block is made of Ru and the dielectric layer is made of SiN, the respective materials may selectively be etched with respect to each other.

The selective deposition of the metal block may be performed by area selective deposition (ASD). ASD may allow selective deposition of the metal block only or primarily on the exposed second portion of the metallic layer. ASD of a metal may selectively deposit the metal in question on exposed metallic areas during the ASD process. ASD may further allow a robust selective deposition of the metal block e.g. providing an improved control on the selective deposition of the metal block. Some examples of the ASD are chemical vapor deposition (CVD), electroless electrochemistry deposition and atomic layer deposition (ALD).

The selective deposition of the metal block may be performed by ALD. ALD may provide an even more improved control on the selective deposition of the metal block compared to the other ASD techniques. In other words, ALD may allow the metal block being deposited only on the exposed second portion of metallic layer in a more controlled manner e.g. with a controlled thickness.

A lateral dimension of the opening defined in the first sacrificial layer in a direction along the parallel spacer line structures may be 1 to 2 times, e.g. 1.5 times, a width of the via hole. A lateral dimension of the opening defined in the first sacrificial layer in a direction transverse to the parallel spacer line structures may be 1.5 to 5 times, e.g. 2 times, a width of the via hole. The larger lateral dimensions of the opening in the first sacrificial layer i.e. along the parallel spacer line structures and transverse to the parallel spacer line structures may facilitate the alignment of the via hole with the metal block. In addition, the larger lateral dimensions of the opening in the first sacrificial layer may address EPE particularly for the ever more aggressive line pitches.

The dielectric layer may include any of or any combination of SiN, $SiO_2$, and SiCN. The dielectric material may be made of any of or any combination of SiN, $SiO_2$, and SiCN. The dielectric layer may be any material which may be etched selective to the metallic layer, allowing exposing the first portion of the metallic layer.

The parallel spacer line structures may include any of or any combination of amorphous silicon (a-Si), amorphous carbon (a-C) and $SiO_2$. The parallel spacer line structures may be made of any of or any combination of a-Si, a-C and $SiO_2$. The sidewall oxide layers may include any of or any combination of $SiO_2$, SiN, or $TiO_x$. The sidewall oxide layers may be made of any of or any combination of $SiO_2$, SiN, or $TiO_x$. Material of the parallel spacer line structures, the sidewall oxide layers and the dielectric layer may be selected based on etch selectivity. In other word, the material of each of the parallel spacer line structures, the sidewall oxide layers and the dielectric layer may be etched selective to the other two.

The interlayer dielectric layer may include any of or any combination of $SiO_2$, and SiCOH. The interlayer dielectric layer may be made of any of or any combination of $SiO_2$, and SiCOH. The interlayer dielectric layer may be any dielectric material compatible with modern fabrication.

The above and other characteristics and features will become apparent from the following detailed description, taken in conjunction with the accompanying drawings, which illustrate, by way of example, the principles of some embodiments. This description is given for the sake of example only, without limiting the scope of the disclosure. The reference figures quoted below refer to the attached drawings.

Figure 1A:
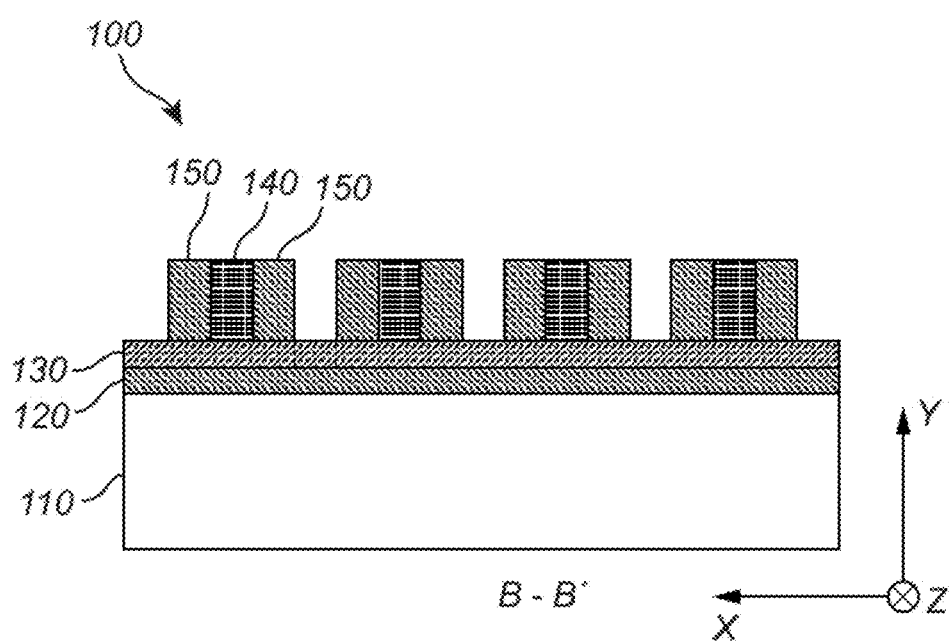
FIG. 1A shows a cross-sectional schematic view of a step of a method, according to example embodiments.

In the different figures, the same reference signs refer to the same or analogous elements.

DETAILED DESCRIPTION

The present disclosure will be described with respect to particular embodiments and with reference to certain drawings but the disclosure is not limited thereto, but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Moreover, the terms top, bottom, over, under and the like in the description and the claims are used for descriptive purposes and not necessarily for describing relative positions. It is to be understood that the terms so used are interchangeable under appropriate circumstances and that the embodiments described herein are capable of operation in other orientations than described or illustrated herein.

It is to be noticed that the term "comprising," used in the claims, should not be interpreted as being restricted to the elements listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a method comprising A and B" should not be limited to method consisting only of two steps A and B. It means that with respect to the present disclosure, the only relevant steps of the method are A and B.

In the description provided herein, numerous specific details are set forth. However, it is understood that embodiments may be practiced without these specific details. In other instances, understood methods, structures, and techniques have not been shown in detail in order not to obscure an understanding of this description. The following terms are provided solely to aid in the understanding example embodiments. A detailed description of several embodiments will now be provided. It is clear that other embodiments can be configured according to the knowledge of persons skilled in the art without departing from the technical teaching herein.

The present disclosure relates to a method for forming a via hole 200 self-aligned with a metal block 190. The metal block 190 and the via hole 200 are typically formed in the back-end of line (BEOL). An embodiment of the method is shown in FIGS. 1-6.

Figure 1B:
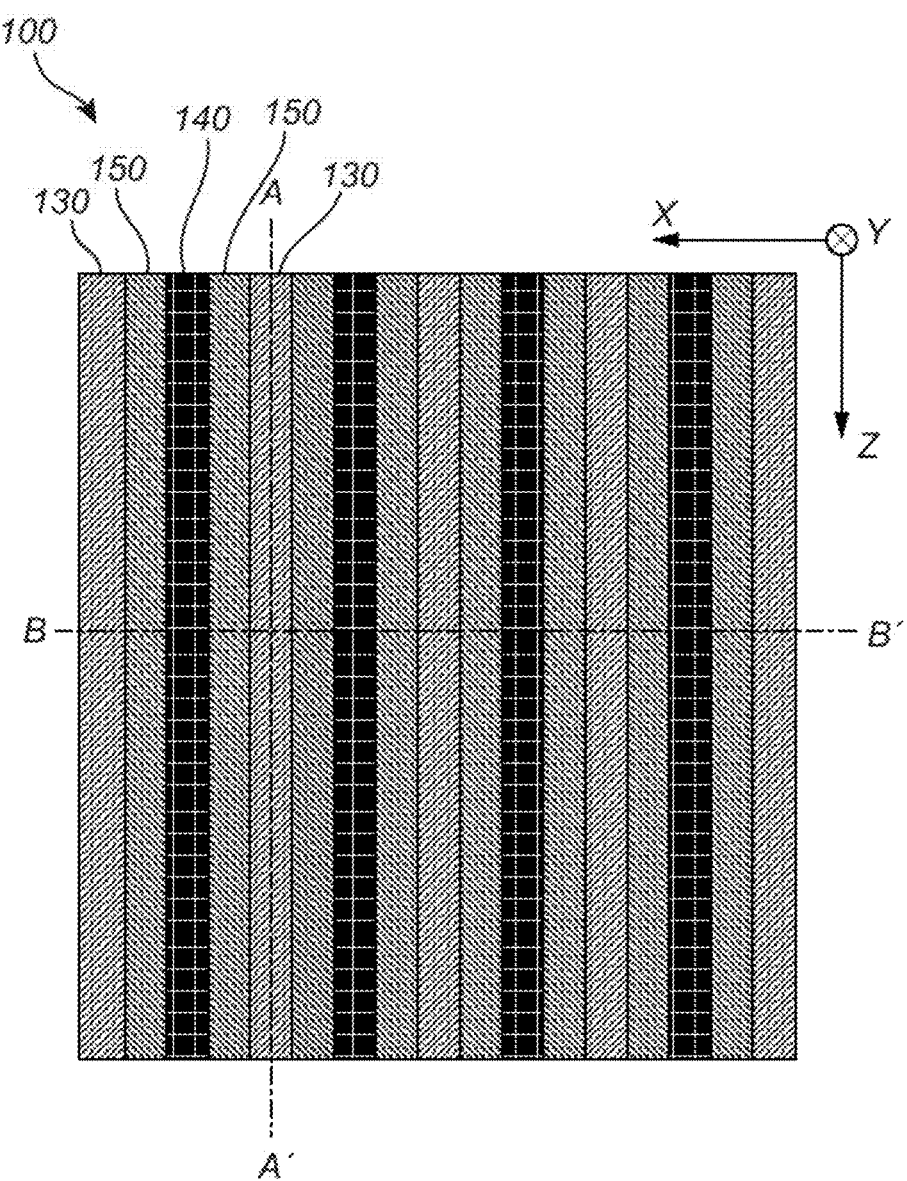
FIG. 1B shows a top schematic view of a step of a method, according to example embodiments.
Figure 1C:
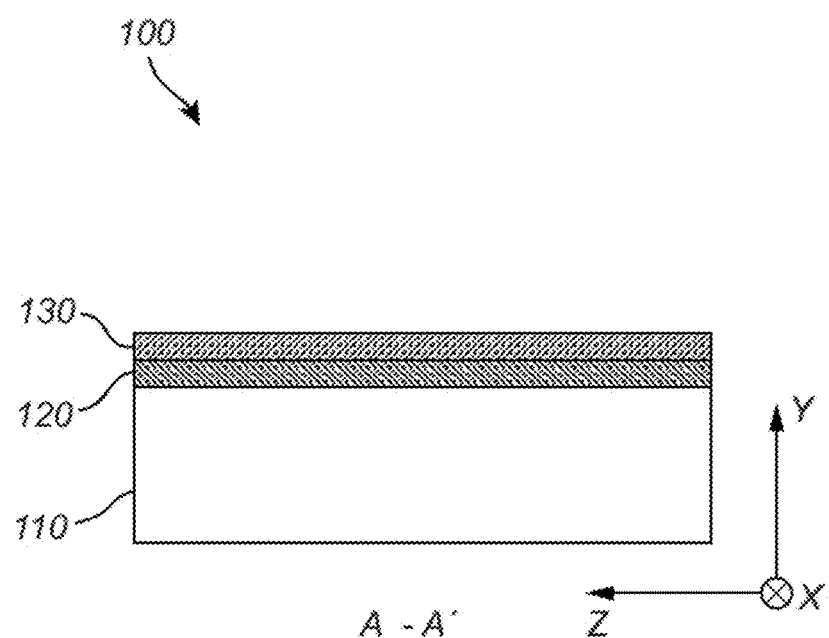
FIG. 1C shows a cross-sectional schematic view of a step of a method, according to example embodiments.

In connection with FIG. 1A, a cross-sectional schematic view of a structure 100 is shown. The structure 100 shown in FIGS. 1A-1C is provided on a substrate. The substrate includes an interlayer dielectric layer 110. The structure 100 shown in FIGS. 1A-1C is provided by forming a metallic layer 120 on the interlayer dielectric layer 110, forming a dielectric layer 130 on the metallic layer 120, forming a plurality of parallel spacer line structures 140 on the dielectric layer 130, the parallel spacer line structures 140 extending along an upper surface of the dielectric layer 130. The structure 100 shown in FIGS. 1A-1C is further provided by forming a sidewall oxide layer 150 on respective sidewalls of the plurality of parallel spacer line structures 140 such that a portion of the dielectric layer 130 is exposed between adjacent sidewall oxide layers 150 of the parallel spacer line structures 140.

The metallic layer 120, the dielectric layer 130, the parallel spacer line structures 140 and the sidewall oxide layer 150 may be formed using conventional methods. Those methods will not be described in detail to avoid undue lengthy discussions concerning understood methods.

In FIGS. 1A-1C, the axis Y denotes a vertical direction corresponding e.g. to a normal direction with respect to an upper surface of the dielectric layer 130. The axis X denotes a first horizontal direction along the upper surface of the dielectric layer 130 and the axis Z denotes a second horizontal direction along the upper surface of the dielectric layer 130, perpendicular to the first direction X. In the following, the substrate, the interlayer dielectric layer 110, the metallic layer 120, the dielectric layer 130, the parallel spacer line structures 140, and the sidewall oxide layer 150 will be described.

The substrate may be any conventional substrate, suitable for semiconductor processing. The substrate may be a Si substrate, a Ge substrate, a SiGe substrate. Other examples include a silicon-on-insulator (SOI) substrate, a GeOI substrate or a SiGeOI substrate. The substrate includes the interlayer dielectric layer 110. The interlayer dielectric layer 110 may be formed on an upper surface of the substrate.

The interlayer dielectric layer 110 may include $SiO_2$ or SiCOH. The dielectric layer 110 may be formed in an understood manner, such as chemical vapor deposition (CVD), plasma-enhanced CVD (PECVD), and spin coating. A typical thickness of the interlayer dielectric layer 110 along Y axis may be in a range from 50 to 500 nm.

The metallic layer 120 may include any of or any combination of TiN, Ru, AlON, AlN, Pt, and $TiO_2$. The metallic layer may be formed in an understood manner, such as CVD or physical vapor deposition (PVD). A typical thickness of the metallic layer 120 along Y axis may be in a range from 5 to 40 nm.

The dielectric layer 130 may be a dielectric layer such as a layer of silicon oxide or some other conventional low-k dielectric layer. The dielectric layer 130 may include SiN, $SiO_2$, SiCN. The dielectric layer 130 may be formed in an understood manner, such as CVD and PECVD. A typical thickness of the dielectric layer 130 along Y axis may be in a range from 5 to 30 nm. The dielectric layer 130 may be any material which may be etched selective to the metallic layer 120. The dielectric layer 130 may be etched while the metallic layer may not be etched. The dielectric layer 130 may be etched significantly faster than the metallic layer 120 e.g. three times to twenty times faster, depending on etch chemistry and deposition technique.

The plurality of parallel spacer line structures 140 may be formed in an understood manner. The plurality of parallel spacer line structures 140 may e.g. be formed by deposition of a layer followed by patterning of the layer. The patterning may be lithographically done. The patterning may define parallel line structures 140 with desired width. The plurality of parallel spacer line structures 140 may include any of or any combination of amorphous silicon, a-Si, amorphous carbon, a-C, or $SiO_2$. A typical width of the plurality of parallel spacer line structures 140 along the X axis may be in a range from 5 to 40 nm. A typical thickness of the plurality of parallel spacer line structures 140 along the Y axis may be in a range from 20 to 100 nm.

The sidewall oxide layers 150 may include any of or any combination of $SiO_2$, SiN, or $TiO_x$. The sidewall oxide layers 150 may be formed in an understood manner, such as CVD or atomic layer deposition (ALD). The sidewall oxide layer 150 may e.g. be formed by depositing a conformal oxide layer of $SiO_2$, SiN, or $TiO_x$ on the plurality of parallel spacer line structures 140. The conformal oxide layer may then be removed from upper surfaces of the parallel spacer line structures 140 and gaps in between the plurality of parallel spacer line structures 140 i.e. remained on side sidewalls of the plurality of parallel spacer line structures 140. A width of the sidewall oxide layers 150 on each respective side of the plurality of parallel spacer line structures 140 i.e. along the X axis may be in a range from 5 to 40 nm.

In connection with FIG. 1B, a top view of the structure 100 shown in FIG. 1A is shown. FIG. 1A is a cross-sectional view of FIG. 1B along a line shown as BB' in FIG. 1B. FIG. 1C shows a cross-sectional vies of FIG. 1B along a line shown as AA' in FIG. 1B i.e. a cut through the dielectric layer 130. In FIG. 1C, a stack of the interlayer dielectric layer 110, the metallic layer 120 and the dielectric layer 130 is shown. As can be clearly seen in FIG. 1B three different materials corresponding to the dielectric layer 130, the parallel spacer line structures 140 and the sidewall oxide layer 150 are visible from above, i.e. along the Y-axis. Those three different materials are commonly referred to as three different tones.

Figure 2A:
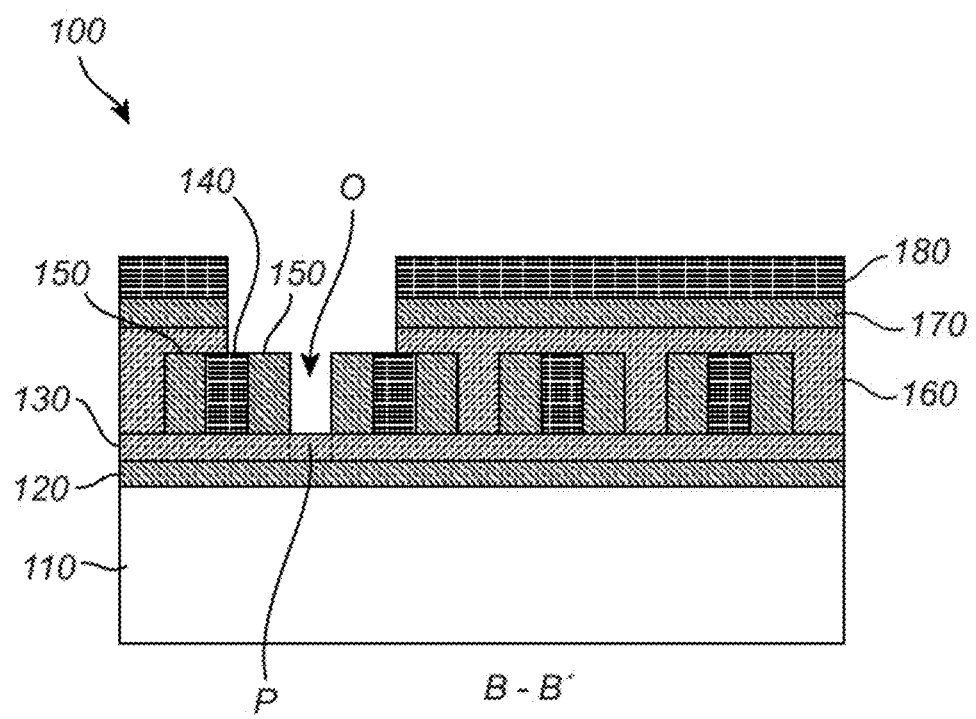
FIG. 2A shows a cross-sectional schematic view of a step of a method, according to example embodiments.

In connection with FIG. 2A, the structure 100 has been processed further by forming a first sacrificial layer 160 covering exposed portions of the dielectric layer 130 and enclosing the parallel spacer line structures 140. The first sacrificial layer 160 may include a stack of layers. FIG. 2A shows a stack of two sacrificial layers 160 and 170. The first sacrificial layers 160 and 170 shown in FIG. 2A may include anti-reflective coatings such Spin-on Carbon (SOC) and Spin-on Glass (SOG) layers. The first sacrificial layers 160 and 170 may be formed in an understood manner, such as spin coating. A typical thickness of the first sacrificial layer 160 may be in a range of 20 to 100 nm. A typical thickness of the first sacrificial layer 170 may be in a range of 5 to 30 nm. FIG. 2A further shows how a mask layer 180 has been formed on the first sacrificial layers 160 and 170. The mask layer 180 shown in FIG. 2A has an opening corresponding to a first portion P of the dielectric layer 130 between adjacent sidewall oxide layers 150 of the parallel spacer line structures 140. The mask layer 180 may be formed in an understood manner. The opening in the mask layer 180 may be made in an understood manner. For instance, the opening in the mask layer 180 may be defined in a lithography step and the mask layer 180 may be a photoresist material. A lateral dimension of the opening, defined in the mask layer 180, along the X axis may be in a range of 5 to 40 nm. A lateral dimension of the opening, defined in the mask layer 180, along the Z axis may be in a range of 5 to 40 nm. FIG. 2A further shows that the structure 100 has been further processed by forming an opening O in the first sacrificial layer 160 to expose a first portion P of the dielectric layer 130 between adjacent sidewall oxide layers 150 of the parallel spacer line structures 140. The opening O in the first sacrificial layer 160 may be formed in an understood manner, such as wet or dry etching of first sacrificial layer 160. For instance, the opening O in the first sacrificial layer 160 may be formed by halogen-based etching using e.g. $C_4F_6$ or $CF_4$. The etching may proceed to expose an upper surface of the first portion P of the dielectric layer 130.

Figure 2B:
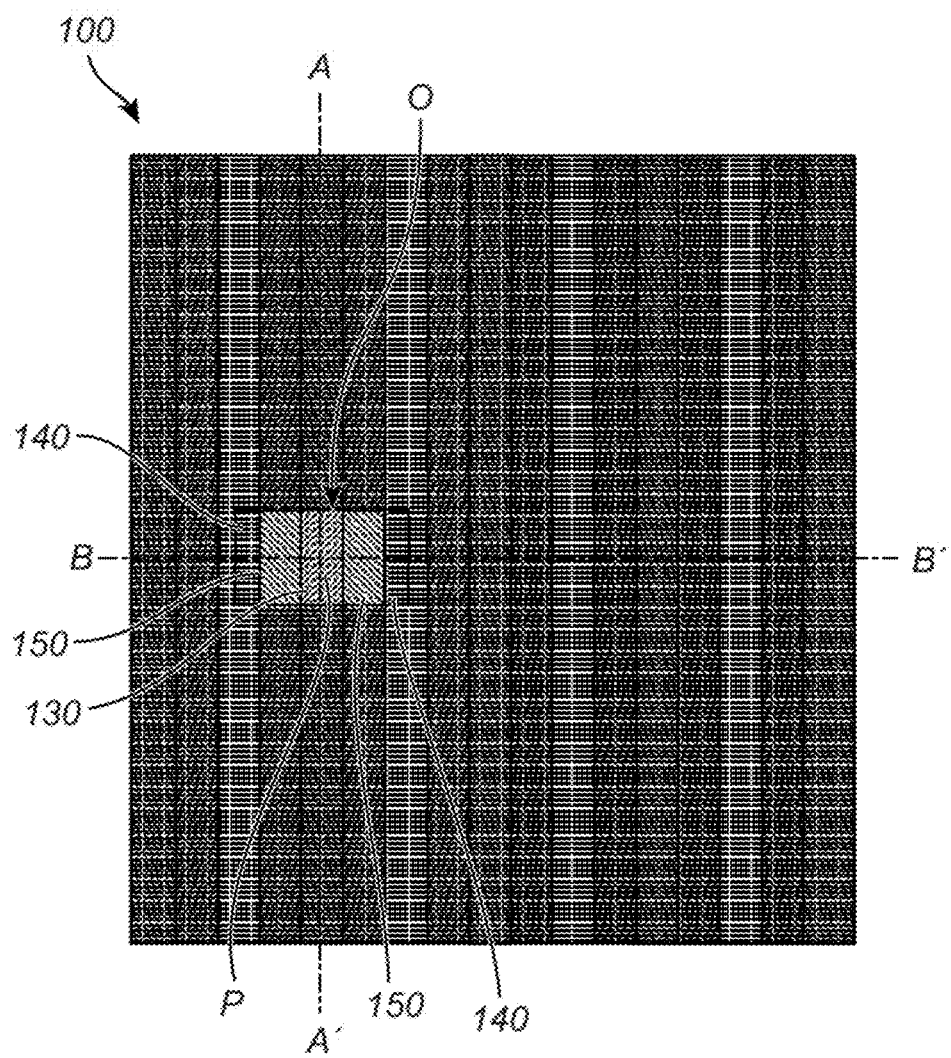
FIG. 2B shows a top schematic view of a step of a method, according to example embodiments.
Figure 2C:
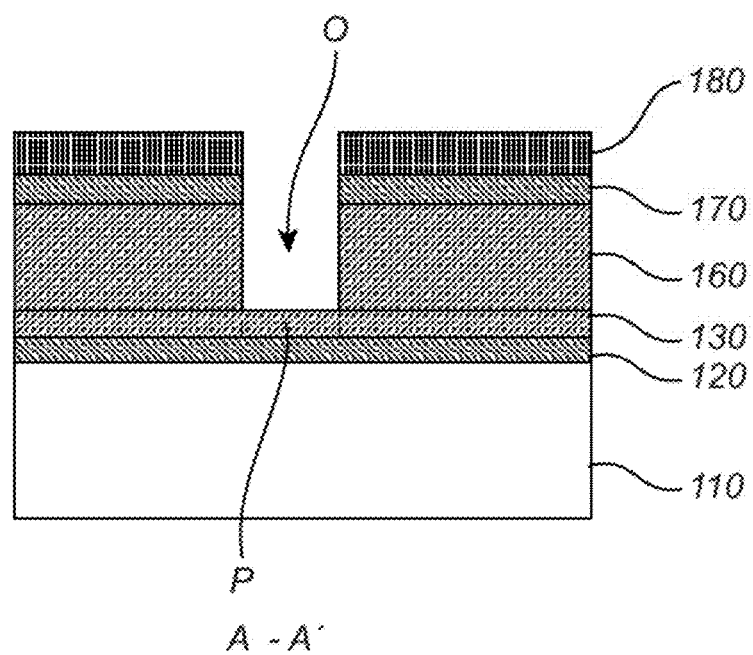
FIG. 2C shows a cross-sectional schematic view of a step of a method, according to example embodiments.

In connection with FIG. 2B, a simplified top view of the structure 100 shown in FIG. 2A is shown. FIG. 2B shows the dielectric layer 130, the parallel spacer line structures 140, and the sidewall oxide layers 150 under the mask layer 180 in relation to the opening O in the first sacrificial layer 160. FIG. 2A is a cross-sectional view of FIG. 2B along a line shown as BB' in FIG. 2B. FIG. 2C shows a cross sectional view of FIG. 2B along a line AA' shown in FIG. 2B.

Figure 3A:
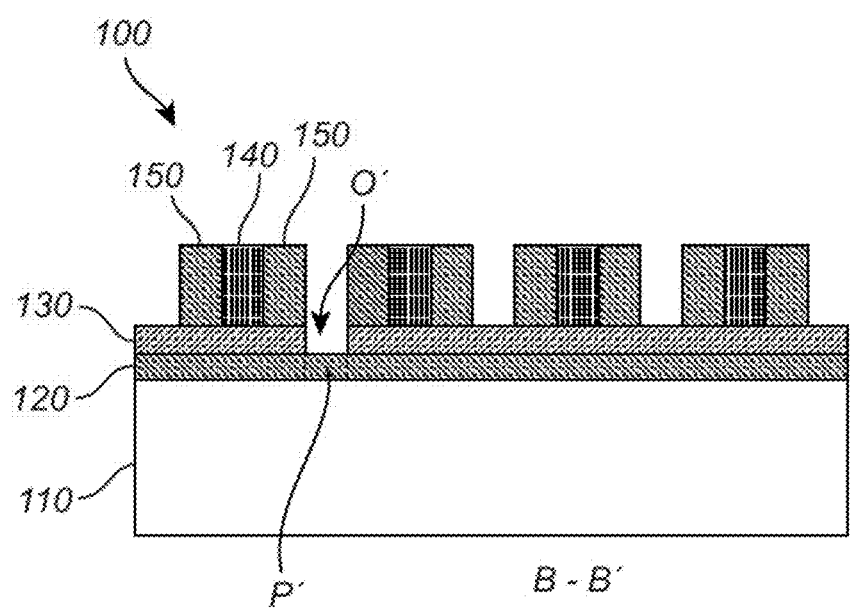
FIG. 3A shows a cross-sectional schematic view of a step of a method, according to example embodiments.

In connection with FIG. 3A, the structure 100 has been further processed by etching, via the opening O in the first sacrificial layer 160, through the first portion P of the dielectric layer 130, thereby forming an opening O' in the dielectric layer 130, exposing a first portion P' of the metallic layer 120. The etching through the first portion P of the dielectric layer 130 may be performed in an understood manner. The etching may e.g. be done using a plasma etch process with halogen chemistry such as $CF_4$ or $C_4F_6$. The etching through the first portion P of the dielectric layer 130 typically proceed to expose a first portion P' of the metallic layer 120. FIG. 3A further shows that the structure 100 has been further processed by removing the first sacrificial layers 160, 170, the mask layer 180. The removal of the first sacrificial layers 160 and 170 may be performed in an understood manner, such as plasma etch.

Figure 3B:
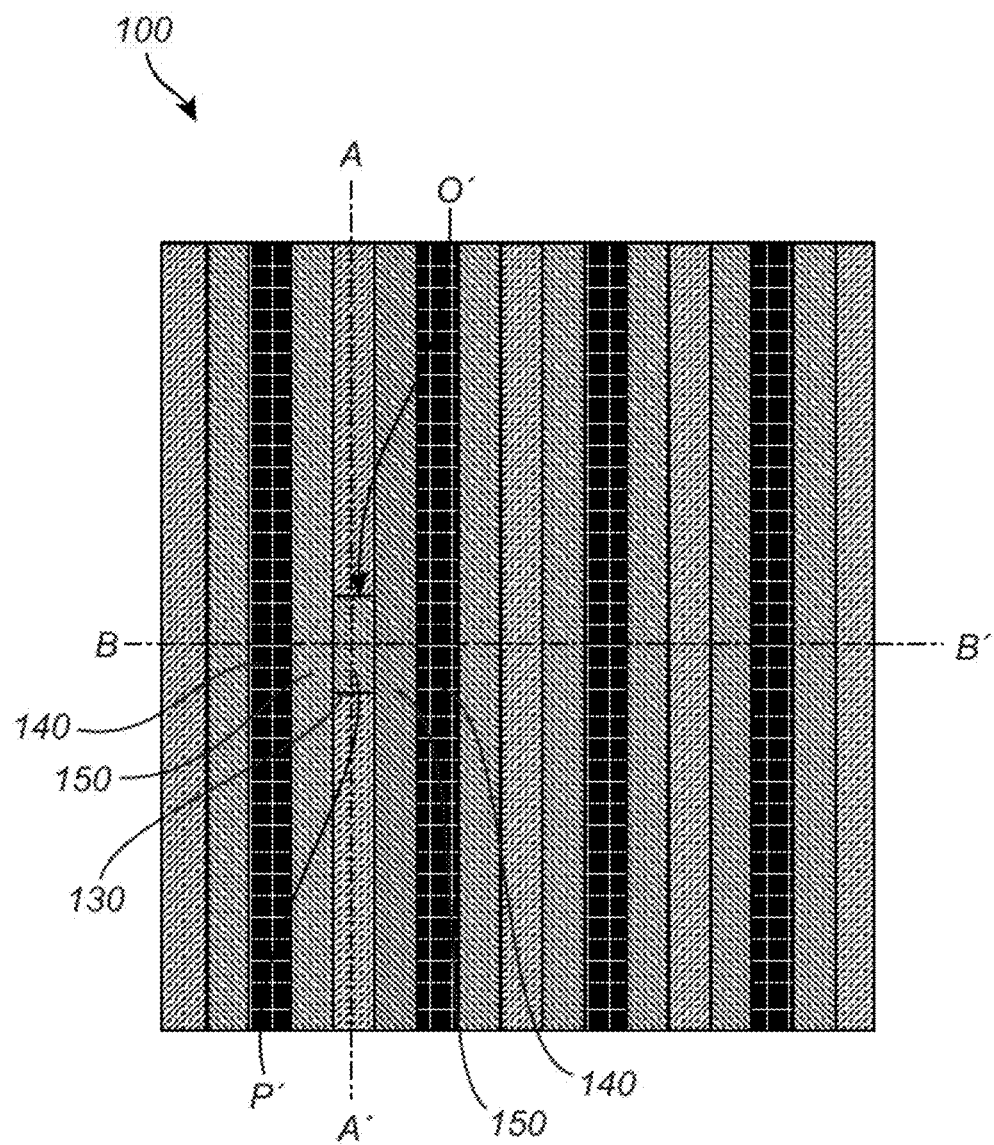
FIG. 3B shows a top schematic view of a step of a method, according to example embodiments.
Figure 3C:
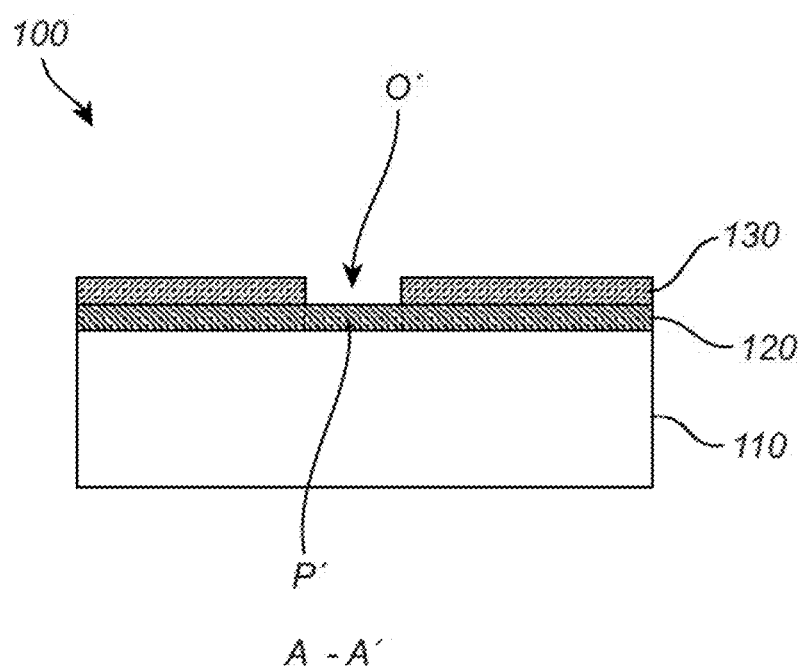
FIG. 3C shows a cross-sectional schematic view of a step of a method, according to example embodiments.

In connection with FIG. 3B a top view of the structure 100 of FIG. 3A is shown. FIG. 3A shows a cross-sectional view of FIG. 3B along a line BB' shown in FIG. 3B. FIG. 3C shows a cross-sectional view of FIG. 3B along a line AA' shown in FIG. 3B. FIG. 3C shows the opening O' in the dielectric layer 130 which exposes the first portion P' of the metallic layer 120.

Figure 4A:
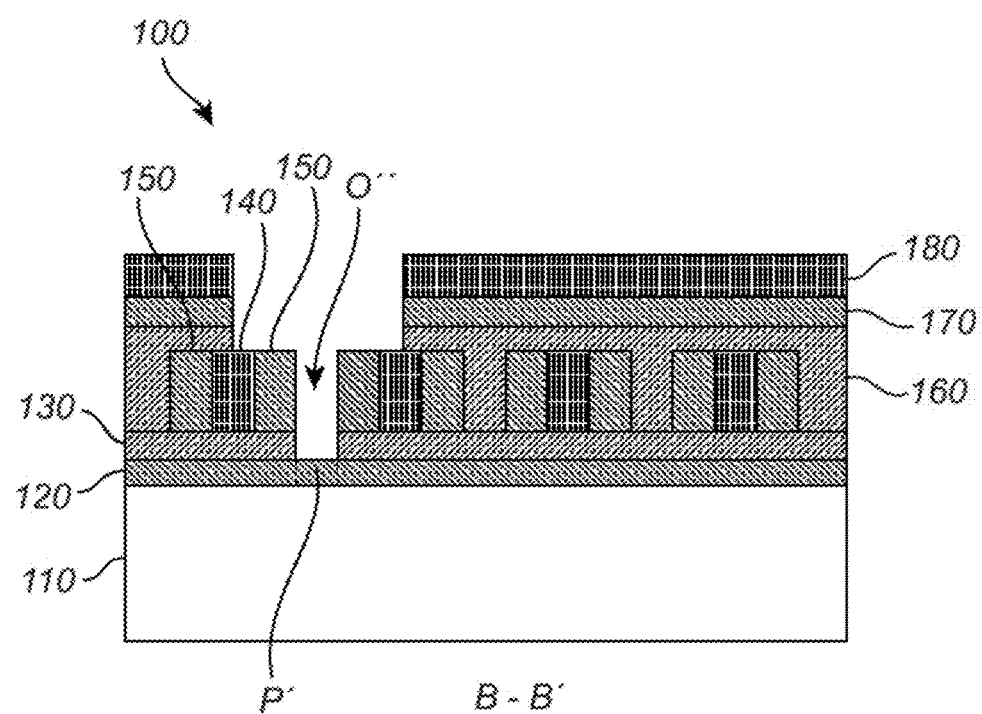
FIG. 4A shows a cross-sectional schematic view of a step of a method, according to example embodiments.

In connection with FIG. 4A, the structure 100 has been provided by forming a second sacrificial layer 160 covering the dielectric layer 130, the first portion P' of the metallic layer 120 and enclosing the parallel spacer line structures 140. The second sacrificial layer 160 may include a stack of layers. FIG. 4A shows a stack of two sacrificial layers 160 and 170. The second sacrificial layers 160 and 170 may be formed in a similar manner as the first sacrificial layers 160 and 170. The second sacrificial layers 160 and 170 may be formed of the same materials of the first second sacrificial layers 160 and 170. FIG. 4A further shows a mask layer 180 has been formed on the sacrificial layers 160 and 170. The mask layer 180 shown in FIG. 4A has an opening partially overlapping the opening O of the dielectric layer 130 and exposing a second portion P''' of the metallic layer 120. The second portion P''' of the metallic layer 120 corresponds to a portion of the first portion P' of the metallic layer 120. The mask layer 180 may be formed in a similar manner as the mask layer 180 formed on the first sacrificial layers 160 and 170. The opening in the mask layer 180 may be made in an understood manner. For instance, the opening in the mask layer 180 may be defined in a lithography step and the mask layer 180 may be a photoresist material. A lateral dimension of the opening, defined in the mask layer 180, along the X axis may be in a range of 20 to 40 nm. A lateral dimension of the opening, defined in the mask layer 180, along the Z axis may be in a range of 10 to 30 nm. FIG. 4A further shows that the structure 100 has been further processed by forming an opening O'' in the second sacrificial layer 160, the opening O'' partially overlapping the opening O of the dielectric layer 130 and exposing a second portion P''' of the metallic layer 120. The second portion P''' of the metallic layer 120 corresponds to a portion of the first portion P' of the metallic layer 120. The opening O' in the second sacrificial layer 160 may be performed in a manner in a similar manner as the opening of the first sacrificial layer 160.

Figure 4B:
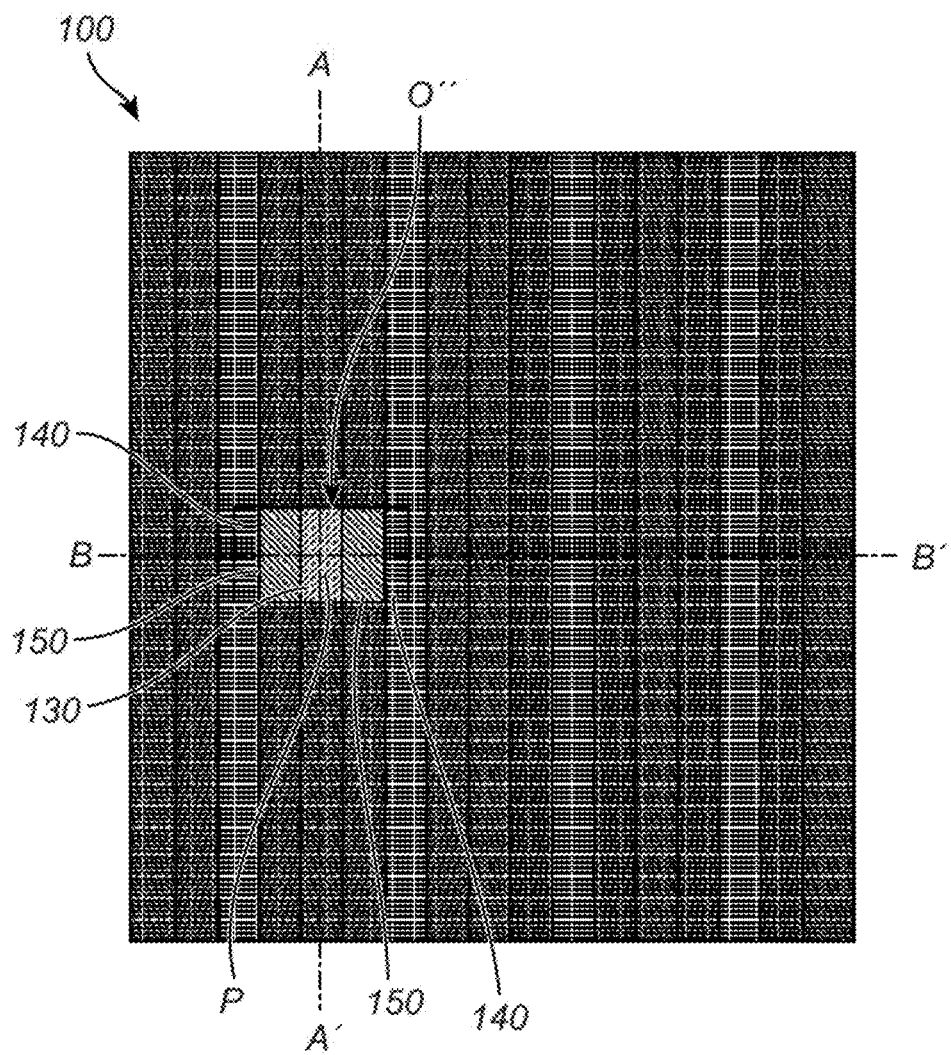
FIG. 4B shows a top schematic view of a step of a method, according to example embodiments.
Figure 4C:
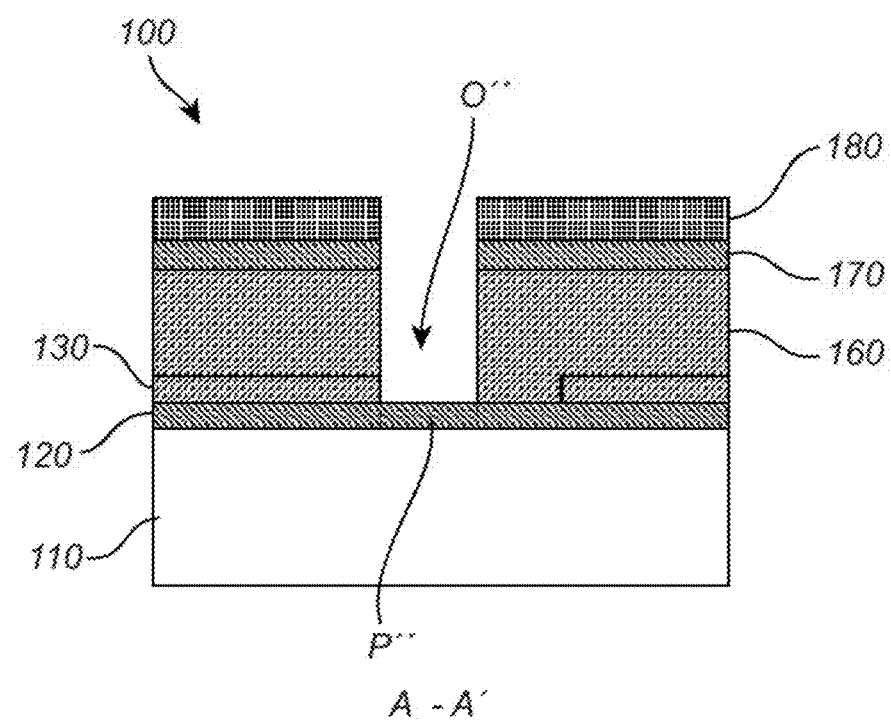
FIG. 4C shows a cross-sectional schematic view of a step of a method, according to example embodiments.

In connection with FIG. 4B, a simplified top view of the structure 100 shown in FIG. 4A is shown. FIG. 4B shows the dielectric layer 130, the parallel spacer line structures 140, and the sidewall oxide layers 150 under the mask layer 180 in relation to the opening O'' in the second sacrificial layer 160. FIG. 4A is a cross-sectional view of FIG. 4B along a line shown as BB' in FIG. 4B. FIG. 4C shows a cross sectional view of FIG. 4B along a line AA' shown in FIG. 4B.

Figure 5A:
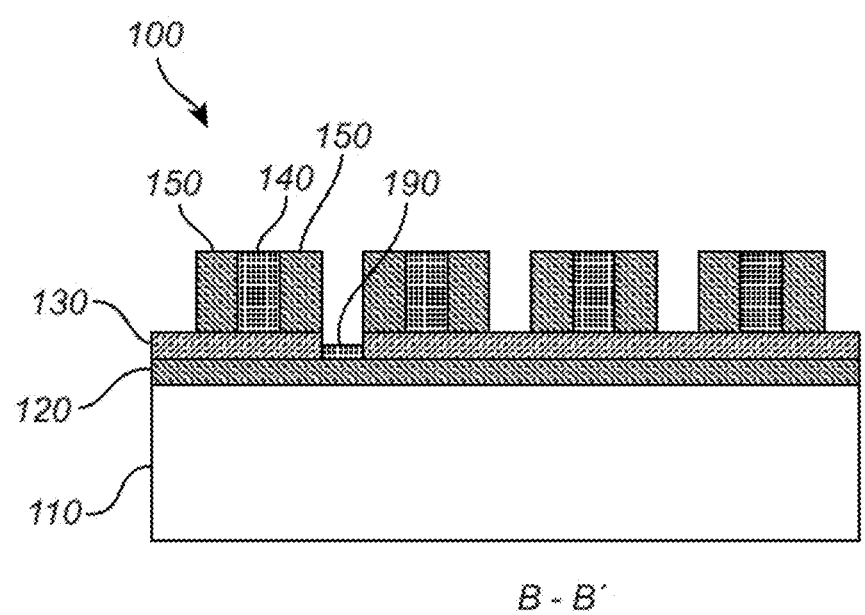
FIG. 5A shows a cross-sectional schematic view of a step of a method, according to example embodiments.
Figure 5B:
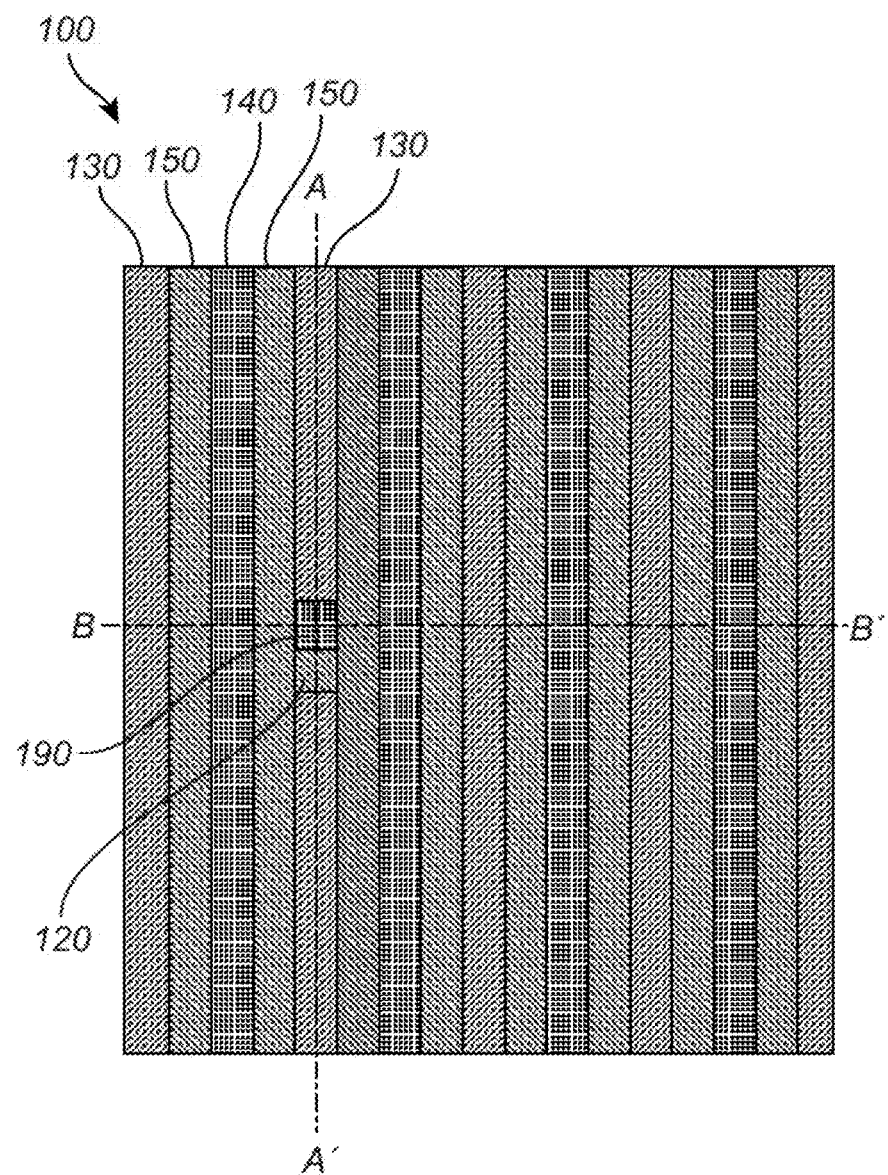
FIG. 5B shows a top schematic view of a step of a method, according to example embodiments.
Figure 5C:
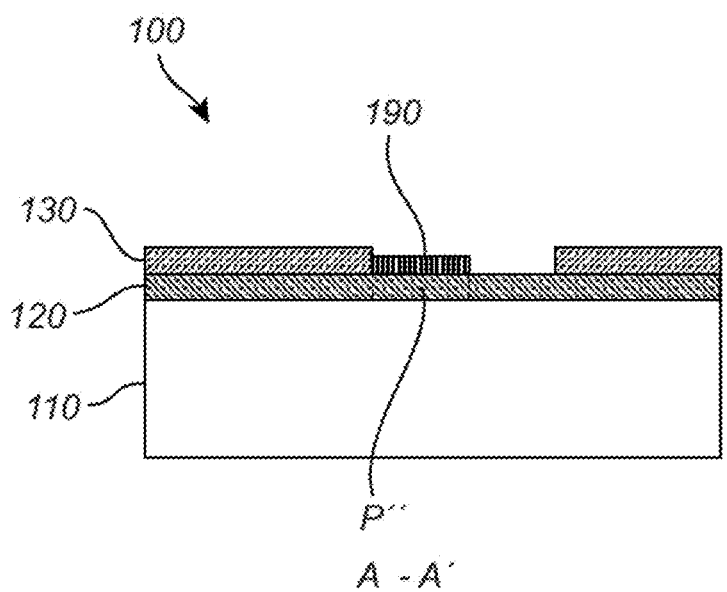
FIG. 5C shows a cross-sectional schematic view of a step of a method, according to example embodiments.

In connection with FIG. 5A, the structure 100 has been provided by selectively depositing a metal block 190 on the exposed second portion P''' of the metallic layer 120. The selective deposition of the metal block 190 may performed by ASD. The ASD of the metal block 190 may be performed in an understood manner, such as CVD, electroless electrochemistry deposition, and ALD. The selective deposition of the metal block 190 may be performed by atomic layer deposition (ALD). A typical thickness of the metal block 190 along the Y axis may be in a range of 1 to 10 nm. The thickness of the metal block 190 may be controlled by e.g. controlling a time of the ASD. The thickness of the metal block 190 may be controlled by e.g. controlling precursors flow during the ASD. The metal block may include any of or any combination of Ru, Rh, Pd, Os, Ir, and Pt. The metal block 190 and the metallic layer 120 may be made of Ru and TiN respectively. FIG. 5B shows a top view of the structure 100 shown in FIG. 5A. FIG. 5A shows a cross-sectional view of FIG. 5B along a line BB' shown in FIG. 5B. FIG. 5C shows a cross-sectional view of the structure 100 shown in FIG. 5B along a line AA' of FIG. 5B. FIG. 5C shows that the metal block 190 has been selectively deposited on the exposed second portion P''' of the metallic layer 120.

Figure 6A:
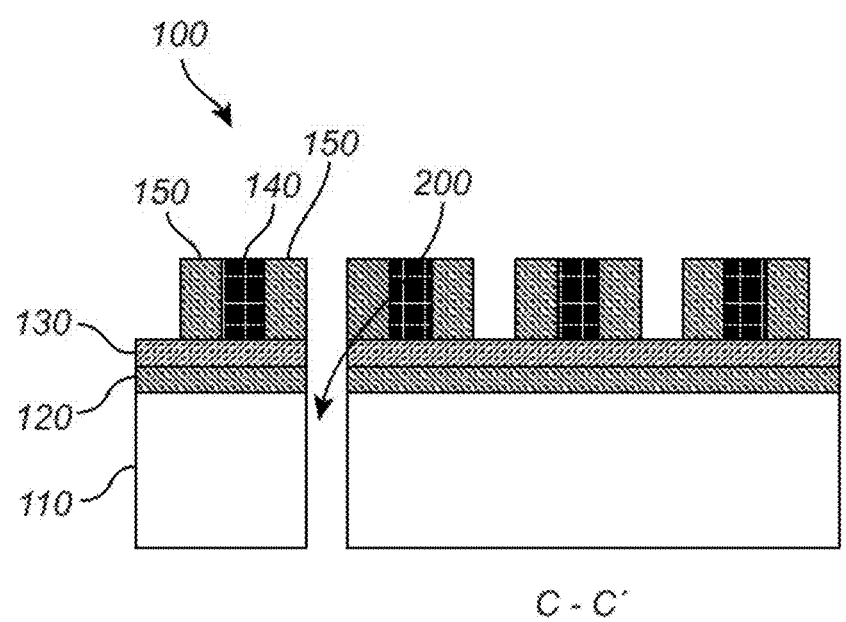
FIG. 6A shows a cross-sectional schematic view of a step of a method, according to example embodiments.
Figure 6B:
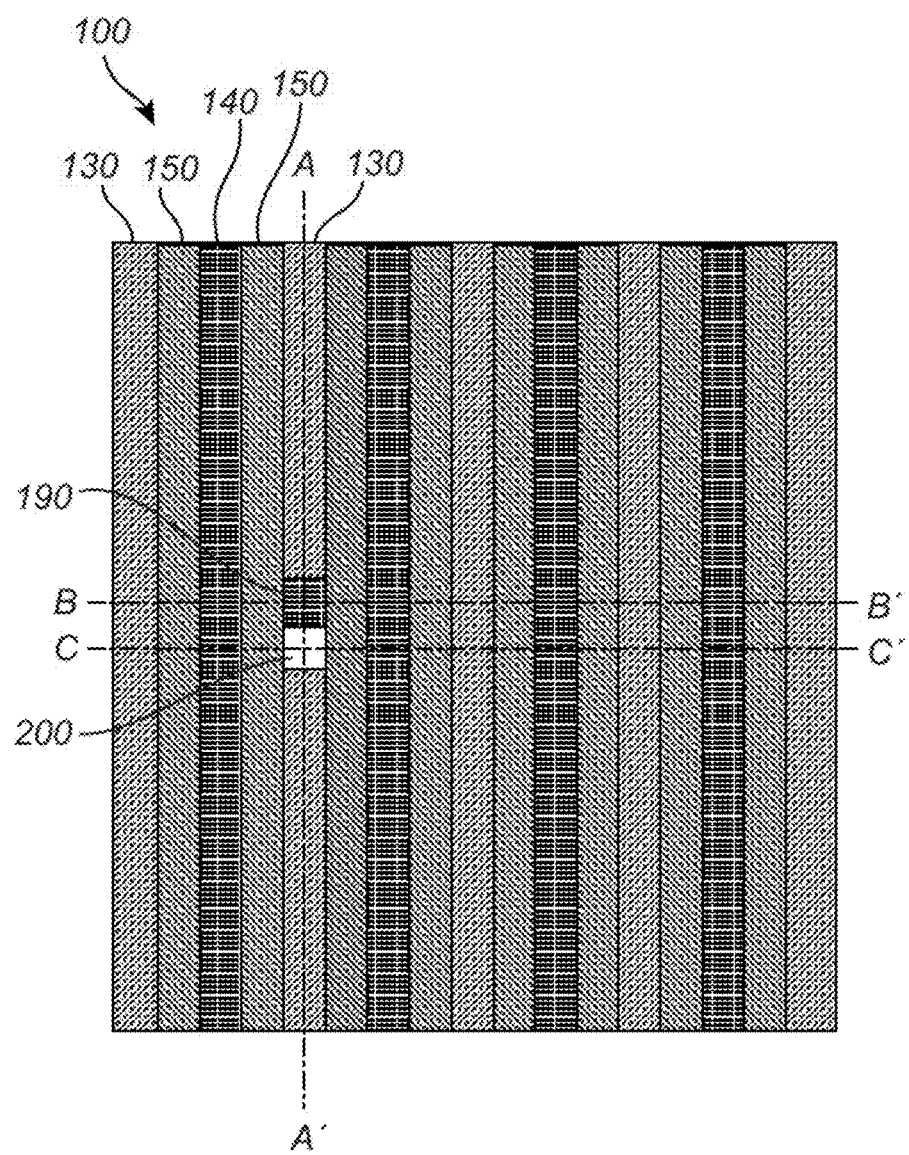
FIG. 6B shows a top schematic view of a step of a method, according to example embodiments.
Figure 6C:
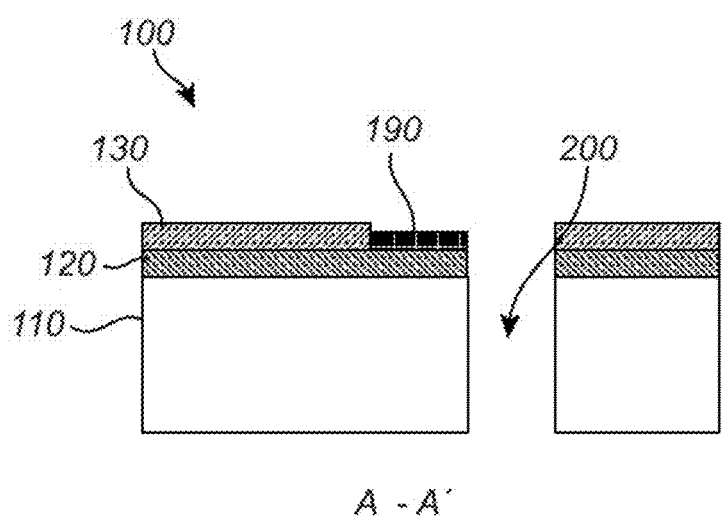
FIG. 6C shows a cross-sectional schematic view of a step of a method, according to example embodiments.

In connection with FIGS. 6A-6C, the structure 100 has been provided by removing the second sacrificial layer 160, thereby exposing a remaining portion of the first portion P' of the metallic layer 120 in the opening O of the dielectric layer 130. The structure 100 has further been provided by etching, via the opening O' of the dielectric layer 130, through the remaining portion of the first portion P' of the metallic layer 120 and the interlayer dielectric layer 110, thereby forming a via hole 200 self-aligned with the metal block 190. The removing of the second sacrificial layer 160 may be performed in a manner as of the first sacrificial layer 160. The etching, via the opening O' of the dielectric layer 130, through the remaining portion of the first portion P' of the metallic layer 120 and the interlayer dielectric layer 110 may be performed in an understood manner, such as wet or dry etching. An example of dry etching is reactive ion etching (RIE). FIG. 6B shows a top of the structure 100 wherein the via hole 200 self-aligned with the metal block 190 are shown. FIG. 6A shows a cross-sectional view of FIG. 6B along a line CC' shown in FIG. 6B. It should be noted that a cross-sectional view of FIG. 6B along a line BB' shown in FIG. 6B may look the same as FIG. 5A. FIG. 6C shows a cross-sectional view of FIG. 6B along a line AA' shown in FIG. 6B. FIG. 6C shows that the via hole 200 is self-aligned with the metal block 190. A lateral dimension of the via hole 200 along the X axis may be in a range from 5 to 30 nm. The lateral dimension of the via hole 200 along the X axis i.e. a width of the via hole 200 may be in the same range as a lateral dimension of the parallel spacer line structures 140 i.e. a width of the parallel spacer line structures 140 such as 5 to 25 nm. A lateral dimension of the via hole 200 along the Z axis may be in a range from 5 to 30 nm. A relation between the width of the via hole 200 and the opening O defined in the first sacrificial layer 160 may be as following: A lateral dimension of the opening O defined in the first sacrificial layer 160 in a direction along the parallel spacer line structures 140 i.e. along the Z axis may be 10 to 40 nm a width of the via hole 200. A lateral dimension of the opening O defined in the first sacrificial layer 160 in a direction transverse to the parallel spacer line structures 140 i.e. along the X axis may, e.g., be two times a width of the via hole 200. A lateral dimension of the metal block 190 along the X axis may be the same as the lateral dimension of the via hole 200 along the X axis. A lateral dimension of the metal block 190 along the Z axis may be in a range from 20 to 40 nm.

In the above, the disclosed concept has mainly been described with reference to a limited number of examples. However, as is readily appreciated by a person skilled in the art, other examples than the ones disclosed above are equally possible within the scope of the disclosed concept, as defined by the appended claims.

What is claimed is:

1. A method for forming a via hole self-aligned with a metal block on a substrate, the substrate comprising an interlayer dielectric layer, the method comprising:
   forming a metallic layer on the interlayer dielectric layer;
   forming a dielectric layer on the metallic layer;
   forming a plurality of parallel spacer line structures on the dielectric layer, wherein the parallel spacer line structures extend along an upper surface of the dielectric layer;
   forming a sidewall oxide layer on respective sidewalls of the plurality of parallel spacer line structures such that a portion of the dielectric layer is exposed between adjacent sidewall oxide layers of the parallel spacer line structures;
   forming a first sacrificial layer covering exposed portions of the dielectric layer and enclosing the parallel spacer line structures;

forming an opening in the first sacrificial layer to expose a first portion of the dielectric layer between adjacent sidewall oxide layers of the parallel spacer line structures;

etching, via the opening in the first sacrificial layer, through the first portion of the dielectric layer, thereby forming an opening in the dielectric layer and exposing a first portion of the metallic layer;

removing the first sacrificial layer;

forming a second sacrificial layer that covers the dielectric layer and the first portion of the metallic layer and encloses the parallel spacer line structures;

forming an opening in the second sacrificial layer, wherein the opening in the second sacrificial layer partially overlaps the opening in the dielectric layer and exposes a second portion of the metallic layer, and wherein the second portion of the metallic layer corresponds to a portion of the first portion of the metallic layer;

selectively depositing a metal block on the exposed second portion of the metallic layer;

removing the second sacrificial layer, thereby exposing a remaining portion of the first portion of the metallic layer in the opening in the dielectric layer; and etching, via the opening in the dielectric layer, through the remaining portion of the first portion of the metallic layer and the interlayer dielectric layer, thereby forming a via hole self-aligned with the metal block.

2. The method according to claim 1, wherein the metallic layer comprises TiN, Ru, AlON, AlN, Pt, or $TiO_2$.

3. The method according to claim 1, wherein the metal block comprises Ru, Rh, Pd, Os, Ir, or Pt.

4. The method according to claim 1, wherein the selective deposition of the metal block is performed by area selective deposition (ASD).

5. The method according to claim 4, wherein the selective deposition of the metal block is performed by atomic layer deposition (ALD).

6. The method according to claim 1, wherein a lateral dimension of the opening in the first sacrificial layer in a direction along the parallel spacer line structures is 1 to 2 times a width of the via hole.

7. The method according to claim 1, wherein a lateral dimension of the opening in the first sacrificial layer in a direction transverse to the parallel spacer line structures is 1.5 to 5 times a width of the via hole.

8. The method according to claim 1, wherein the dielectric layer comprises SiN, $SiO_2$, or SiCN.

9. The method according to claim 1, wherein the parallel spacer line structures comprise amorphous silicon, a-Si, amorphous carbon, a-C, or $SiO_2$.

10. The method according to claim 1, wherein the sidewall oxide layers comprise $SiO_2$, SiN, or $TiO_x$.

11. The method according to claim 1, wherein the interlayer dielectric layer comprises $SiO_2$ or SiCOH.

* * * * *